(12) United States Patent
Weber

(10) Patent No.: US 6,565,765 B1
(45) Date of Patent: May 20, 2003

(54) METHOD FOR MANUFACTURING A SENSOR HAVING A MEMBRANE

(75) Inventor: Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 37 days.

(21) Appl. No.: 09/598,543

(22) Filed: Jun. 21, 2000

(30) Foreign Application Priority Data

Jun. 22, 1999 (DE) .......................................... 199 28 297

(51) Int. Cl.[7] .................................................. B44C 1/22
(52) U.S. Cl. .............................. 216/83; 216/96; 216/99; 438/745; 438/753
(58) Field of Search ............................... 216/83, 96, 99; 438/745, 753

(56) References Cited

U.S. PATENT DOCUMENTS

| 4,543,266 | A | * | 9/1985 | Matsuo et al. ................. 427/38 |
| 4,978,421 | A | * | 12/1990 | Bassous et al. .............. 156/646 |
| 5,051,379 | A | * | 9/1991 | Bayer et al. ................. 437/225 |
| 5,071,510 | A | * | 12/1991 | Findler et al. ............... 156/647 |
| 5,562,801 | A | * | 10/1996 | Nulty ....................... 156/643.1 |
| 5,633,209 | A | * | 5/1997 | Leedy ...................... 435/228 H |
| 5,804,462 | A | * | 9/1998 | Liu et al. ....................... 438/53 |
| 5,879,572 | A | * | 3/1999 | Folsom et al. ................. 216/49 |
| 5,966,617 | A | * | 10/1999 | Ismail ......................... 438/286 |
| 6,268,245 | B1 | * | 7/2001 | Wu ............................... 438/253 |
| 6,271,079 | B1 | * | 8/2001 | Wei et al. .................... 438/239 |
| 6,294,102 | B1 | * | 9/2001 | Bennett et al. ................ 216/37 |

FOREIGN PATENT DOCUMENTS

JP            06-117919    * 4/1994    ............. G01J/1/02

* cited by examiner

*Primary Examiner*—Randy Gulakowski
(74) *Attorney, Agent, or Firm*—Kenyon & Kenyon

(57) ABSTRACT

In a method for manufacturing a sensor having a membrane, a silicon nitride layer is deposited on the upper side of a silicon substrate. For that, an LPCVD or PECVD process is used. From the lower side of the silicon substrate, an opening is etched in which ends at the lower side of the silicon nitride layer.

9 Claims, 1 Drawing Sheet

METHOD FOR MANUFACTURING A SENSOR HAVING A MEMBRANE

BACKGROUND INFORMATION

Already known are methods for manufacturing sensors, where a plurality of electric layers are deposited on the upper side of a silicon substrate. Starting from the back of the silicon substrate, an opening is then etched which reaches up to the dielectric layers. Usually, a silicon oxide layer is used as the lowest dielectric layer which comes to rest directly on the silicon substrate. This layer has the problem that, during the etching processes used for etching in the opening, the silicon oxide layer is usually slightly attacked. Therefore, the thickness of a membrane produced in such a way cannot be controlled accurately.

SUMMARY OF THE INVENTION

The method according to the present invention has the advantage over the related art that the membrane thickness is controlled accurately. This is achieved by particularly simple means.

By using a silicon oxide layer which, in its thickness, is selected such that it is removed during the etching of the opening, an improved adhesion of the silicon nitride layer to the silicon substrate can be achieved. Moreover, the oxide layer acts as mechanical isolation so that mechanical stresses appearing in the nitride layer, for example, during high-temperature processes, are reduced. In this manner, slip lines are prevented in the substrate during subsequent high-temperature steps. A high-temperature step is the reoxidation of the silicon nitride layer, which is used for forming an adhesion-improving silicon oxide layer for subsequent metallization steps. Preferably used as material for the measuring element is platinum, since this material has a well-controllable temperature dependence of the electrical resistance and a good chemical stability. By using further silicon oxide layers, a protection of the metallic measuring element is achieved, and mechanical stresses in the membrane can be adjusted selectively. By embedding intermediate layers of silicon nitride, the stresses in the membrane can be adjusted in a broader range, and a slight moisture absorption can be achieved.

DETAILED DESCRIPTION

Figure 1:
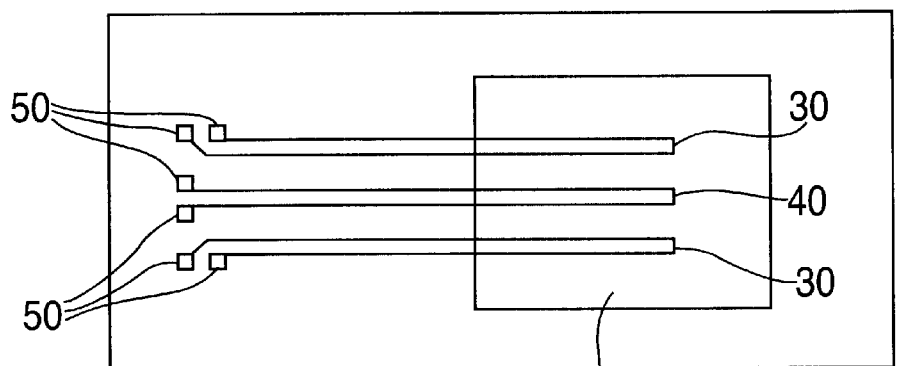
FIG. 1 shows a top view of a sensor having a membrane.

FIG. 1 shows a top view of a sensor having a frame of single-crystalline silicon and a membrane 20. Membrane 20 is formed out from dielectric layers. Formed on membrane 20 are different metallic sensor elements, here, for example, a heating resistor element 40 and temperature measuring elements 30 which can be contacted with the assistance of connecting regions 50.

The sensor shown in FIG. 1 can be used as a mass flow sensor by heating heating element 40 by a flow of electric current supplied via connecting regions 50. Temperature measuring elements 30 are used for detecting the temperature on membrane 20. To that end, the electrical resistance through temperature measuring elements 30 is measured via connecting regions 50. Used as material for elements 30, 40 is, for example, platinum, since this material has a clear temperature dependence of the electrical resistance. When the sensor according to FIG. 1 is exposed to an air flow, the heating caused by heater 40 decreases as a function of the strength of the air flow. This decrease can be detected by measuring the temperature at temperature measuring elements 30.

Figure 2:
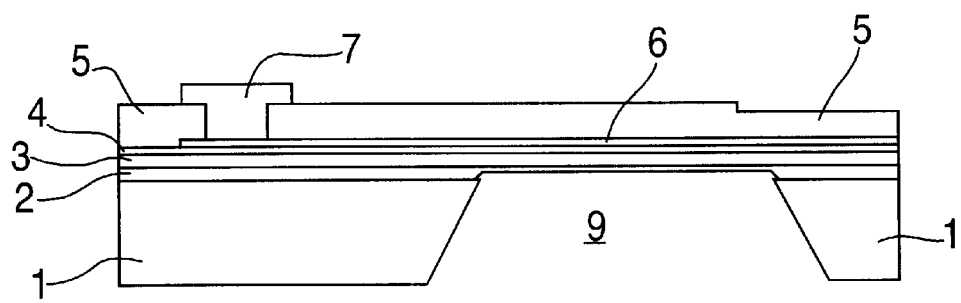
FIG. 2 shows a cross-section through a sensor according to the related art.

FIG. 2 shows a cross-section through a sensor element according to FIG. 1. The example according to FIG. 2 is a sensor manufactured using already known methods.

For manufacturing the sensor, first a silicon substrate 1 is provided, on which a plurality of layers are then deposited. In a first depositing step, a silicon oxide layer 2 is deposited, and then a silicon nitride layer 3 is deposited on silicon oxide layer 2. The upper side of silicon nitride layer 3 is converted to a silicon oxide layer again by a temperature treatment, while oxygen is being supplied. In this manner, silicon oxide layer 4, which is arranged on the upper side of silicon nitride layer 3, is formed. On this superficial silicon oxide layer 4, a platinum layer 6 is deposited and patterned by patterning processes in such a manner that the patterns shown in FIG. 1 are formed. Subsequently, a protective layer 5 made of silicon oxide is deposited which is used to protect the elements formed out of the platinum layer. By making openings in silicon oxide layer 5 and depositing a metallization 7, connecting regions 50 are then produced by which an electric contact to the metallic heating or measuring elements embedded in the different dielectric layers can be provided. To then make the membrane, i.e., a self-supporting region which is only formed of the thin deposited layers, an opening 9 is etched in starting from the lower side of silicon substrate 1, opening 9 being etched until silicon substrate 1 is completely removed in membrane region 20. To that end, usually an alkaline etching solution, for example, KOH is used. Silicon oxide is largely resistant in this etching medium so that the etching essentially ends at the lower silicon oxide layer 2. The resistance of silicon oxide in alkaline etching mediums is not such, however, that no or only a negligibly small etch attack takes place. It is rather that a slight attack of the silicon oxide layer takes place, which cannot be neglected, particularly when very thin layer thicknesses are considered for membrane 20. In FIG. 2, this is indicated by a thinning of layer 2 in the region of opening 9.

Typical layer thicknesses for the used layers are on the order of 50 nm to 1 $\mu$m.

Figure 3:
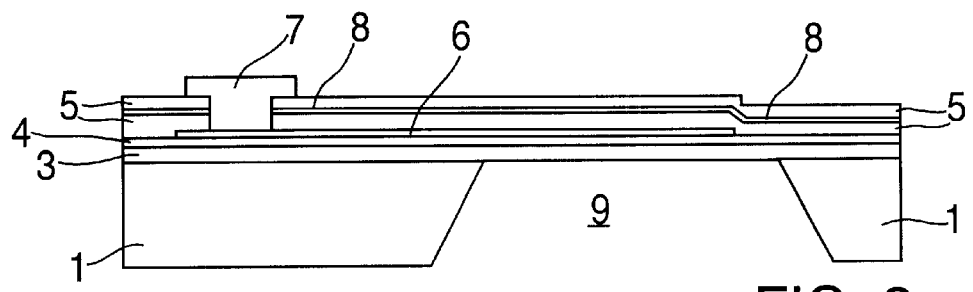
FIG. 3 shows a cross-section through a sensor according to the present invention.

In FIG. 3, a first embodiment of the manufacturing process according to the present invention is explained. Starting from a silicon substrate 1, a silicon nitride layer 3 is produced directly on the surface of this silicon substrate 1. The silicon nitride layer 3 is deposited by an LPCVD process (low pressure chemical vapor deposition process) by which high-quality silicon nitride layers can be deposited at temperatures of approximately 700° C.–800° C. On that, as already explained with regard to FIG. 2, a silicon oxide layer is produced, and a platinum layer is applied and patterned. Then, a silicon oxide layer is deposited on the platinum layer, for example, by a PECVD process (plasma enhanced chemical vapor deposition process). Embedded in this protective layer 5 made of silicon oxide are intermediate layers of silicon nitride 8. These layers can also be produced by a PECVD process. The covering layer, as already explained with regard to FIG. 2, contains an opening which permits the platinum layer to be contacted with the assistance of a metallization 7. Moreover, an opening 9, which reaches up to silicon nitride layer 3, is etched in, starting from the back of silicon substrate 1. Since silicon nitride is hardly attacked by alkaline etching solutions at all, no influencing of the membrane thickness whatsoever is involved by this etching process either. Therefore, the membrane thickness can be adjusted particularly accurately by using a lower layer of silicon nitride. That is also because the deposition of the layers can be carried out with high accuracy so that the layer thickness can be adjusted very accurately by preventing these membrane layers from being etched subsequently.

The embedded silicon nitride layers are used for adjusting the mechanical stresses in the membranes and for reducing the moisture sensitivity. By omitting the lower silicon oxide layer, the membrane stress can no longer be influenced. The membrane stress (desired is a slight tensile stress) is now adjusted by implementing the protective layer located above the platinum by an appropriate construction of silicon oxide and silicon nitride.

Figure 4:
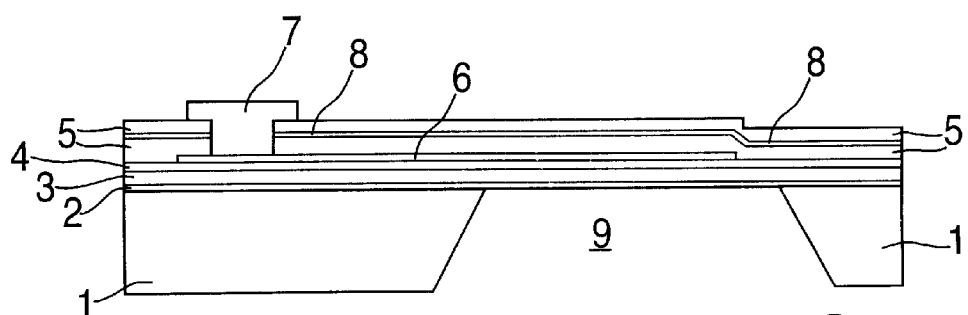
FIG. 4 shows a cross-section through a sensor according to the present invention.

FIG. 4 shows an exemplary embodiment which, except for layer 2, corresponds to the design as is shown in FIG. 3. Layer 2, again, is a silicon oxide layer which was produced as first layer on silicon substrate 1. Here, however, the layer thickness of silicon oxide layer 2 is selected to be so small that, during the subsequent etching in of opening 9 by the alkaline etching solution, this silicon oxide layer 2 is completely removed in the region of membrane 20, i.e., above opening 9. In this manner, the etching stops only at silicon nitride layer 3 again, which allows the thickness of the membrane to be controlled very accurately. However, in contrast to FIG. 3, in the case of FIG. 4, the direct adhesion to silicon substrate 1 is not brought about by a boundary surface of silicon nitride to silicon but provision is made for an intermediate layer of silicon oxide. It has turned out that by using intermediate layers of silicon oxide, the adhesion between silicon nitride layer 3 and silicon substrate 1 is improved and slip lines can be prevented. This silicon oxide layer 2 is typically dimensioned on the order of 20–150 nm.

What is claimed is:

1. A method for manufacturing a sensor having a membrane, comprising the steps of:

providing a silicon substrate having an upper side and a lower side;

depositing a silicon nitride layer on the upper side of the silicon substrate, using one of an LPCVD process and a PECVD process;

after the depositing step, etching-in an opening starting from the lower side of the silicon substrate using an etching process which stops at the silicon nitride layer; and providing a silicon oxide layer underneath the silicon nitride layer, a thickness of the silicon oxide layer and the etching process being such that the silicon oxide layer is completely removed in a region of the opening without etching the silicon nitride layer.

2. The method according to claim 1, further comprising the step of converting, on the silicon nitride layer, a superficial layer of the silicon nitride layer to a silicon oxide layer by temperature treatment under oxygen.

3. The method according to claim 2, further comprising the steps of depositing and patterning a platinum layer on the silicon oxide layer.

4. The method according to claim 1, further comprising the step of producing, on the silicon nitride layer, a CVD oxide layer.

5. The method according to claim 1, further comprising the step of depositing a superficial covering layer composed of silicon oxide, wherein the superficial covering layer is deposited over the silicon nitride layer.

6. The method according to claim 5, further comprising the step of depositing further silicon nitride layers on the superficial covering layer composed of silicon oxide, wherein the further silicon nitride layers include silicon oxide.

7. The method according to claim 5, further comprising the step of depositing further superficial covering layers composed of silicon oxide which include embedded silicon nitride layers.

8. The method according to claim 1, wherein the silicon nitride layer is deposited using the LPCVD process.

9. The method according to claim 1, wherein the silicon nitride layer is deposited using the PECVD process.

* * * * *